United States Patent [19]

Sakamoto

[11] Patent Number: 5,422,622
[45] Date of Patent: Jun. 6, 1995

[54] FLEXIBLE DISTRIBUTION SHEET

[75] Inventor: Yukio Sakamoto, Nagaokakyo, Japan

[73] Assignee: Murata Manufacturing Co., Ltd., Kyoto, Japan

[21] Appl. No.: 139,542

[22] Filed: Oct. 19, 1993

[30] Foreign Application Priority Data

Oct. 19, 1992 [JP] Japan .................................. 4-279840
Oct. 21, 1992 [JP] Japan .................................. 4-283229

[51] Int. Cl.6 ............................................ H01C 3/06
[52] U.S. Cl. ..................................... 338/210; 338/61; 338/211
[58] Field of Search ................. 338/210, 211, 99, 114, 338/306, 308, 61

[56] References Cited

U.S. PATENT DOCUMENTS

| | | | |
|---|---|---|---|
| 3,541,491 | 11/1970 | Worster | 338/211 X |
| 3,582,833 | 6/1971 | Kordos | 338/61 X |
| 3,638,162 | 1/1972 | McWade | 338/320 |
| 4,355,293 | 10/1982 | Driscoll | 338/184 |
| 4,626,664 | 12/1986 | Grise | 338/211 X |
| 4,908,497 | 3/1990 | Hjortsberg | 338/61 X |
| 5,157,372 | 10/1992 | Langford | 338/211 |
| 5,229,582 | 7/1993 | Graham | 338/211 X |

Primary Examiner—Marvin M. Lateef
Attorney, Agent, or Firm—Ostrolenk, Faber, Gerb & Soffen

[57] ABSTRACT

A flexible distribution sheet (11) including a plurality of conductors (13a to 13d) which are formed on an upper surface of a long sheet (12) having flexibility to extend from an end (12a) to another end (12b) thereof. The plurality of conductors (13a to 13d) are made of resistant conductive materials having resistance values within a range of 1 Ω to 100 kΩ across the same.

14 Claims, 6 Drawing Sheets

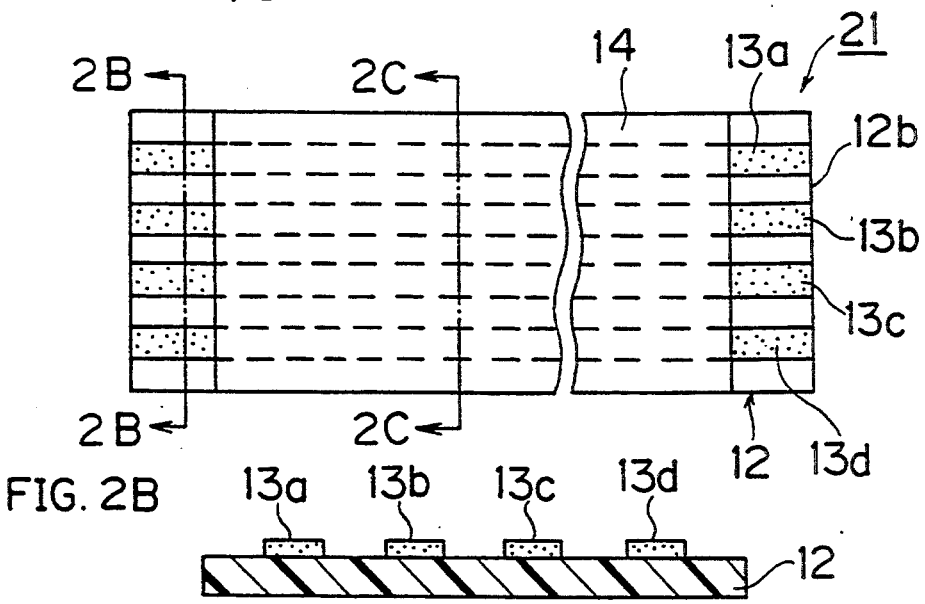
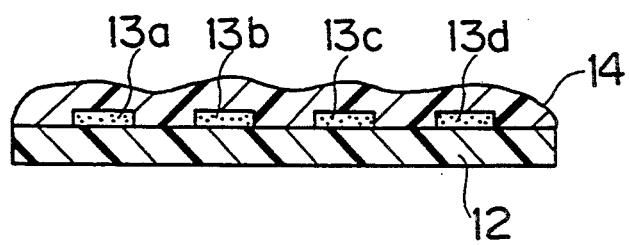
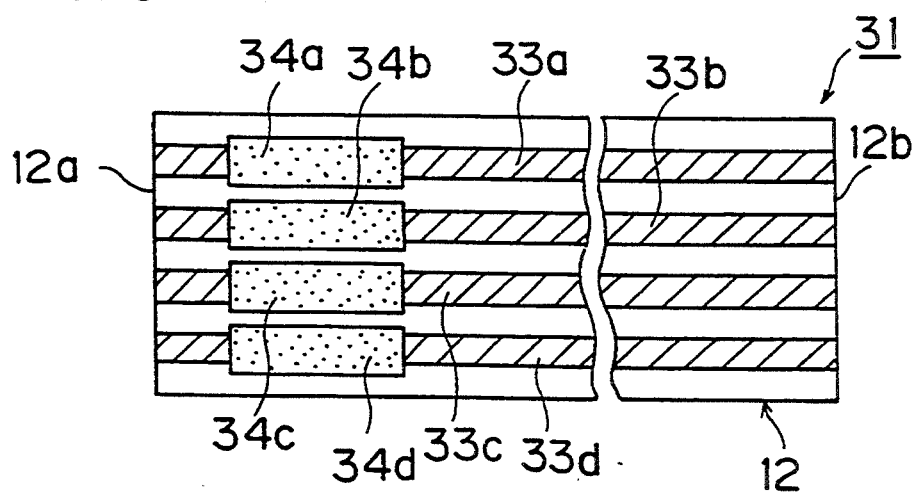

FLEXIBLE DISTRIBUTION SHEET

BACKGROUND OF THE INVENTION

1. Field of the Invention

The present invention relates to a flexible distribution sheet which is applied to connection in the interior of an electronic device or between such devices, and more particularly, it relates to a flexible distribution sheet having a structure for suppressing occurrence of an electromagnetic fault.

2. Description of the Background Art

In general, a flexible distribution sheet is widely employed in an electronic device such as an office automation product, to serve as a distribution interface in the interior of the device or between such devices. FIGS. 9A and 9B are a plan view and a sectional view showing an example of such a conventional Flexible distribution sheet 1. The flexible distribution sheet 1 is provided with a long sheet 2 having flexibility, which is made of synthetic resin, for example. A plurality of long conductors 3a to 3d are arranged on an upper surface of the sheet 2 in parallel with each other at prescribed intervals, to extend entirely along the longitudinal direction of the sheet 2. The plurality of conductors 3a to 3d are made of a metal material such as silver or copper, which is excellent in conductivity. The conductors 3a to 3d are generally formed by sticking metal foil onto the upper surface of the sheet 2 and thereafter etching the same, or providing such conductors 3a to 3d on one surface of the sheet 2 by plating.

The conductors 3a to 3d are covered with a cover film 4 of insulating resin, except both ends and portions which are around the same. The cover film 4 is formed by covering the conductors 3a to 3d with insulating resin, or sticking a film of insulating resin onto the conductors 3a to 3d.

The flexible distribution sheet 1 has sufficient flexibility as a whole, whereby it is possible to reliably electrically connect portions to be connected with each other with the flexible distribution sheet 1, even if an obstacle is present in a minute portion of the device or between the devices.

When an electric signal such as a digital signal having frequency components of a wide range is fed in the flexible distribution sheet 1 to cause impedance mismatching on ends of the conductors 3a to 3d, standing waves are generated in the conductors 3a to 3d due to resonance by reflection. Such generation of standing waves leads to increase in radiation efficiency for electromagnetic waves in a frequency band around the standing waves. Consequently, higher harmonic wave components and the like are radiated to the exterior, to cause an electromagnetic fault in an electronic device or a cable provided around the flexible distribution sheet 1.

In general, therefore, a filter element is connected to each end of the flexible distribution sheet 1 in order to remove EMI (electron magnetic interference) noise, thereby preventing the aforementioned electromagnetic fault resulting from impedance mismatching. Such a noise filter has a structure such as an L-type, $\pi$-type or T-type structure, which is formed by a capacitor and an inductor.

However, such a noise filter is merely adapted to remove the aforementioned EMI noise, with no contribution to an operation of the electronic device in which the same is assembled. Therefore, omission of such a noise filter is awaited for the purpose of miniaturizing the electronic device.

SUMMARY OF THE INVENTION

An object of the present invention is to provide a flexible distribution sheet which has a structure for suppressing radiation of EMI noise.

According to a wide aspect of the present invention, provided is a flexible distribution sheet which comprises a long sheet having flexibility and a plurality of long conductors which are formed to extend along the longitudinal direction of the sheet. At least one of the conductors is at least partially made of a resistant conductive material, so that a resistance value across this conductor is within a range of 1 $\Omega$ to 100 k$\Omega$.

In the flexible distribution sheet according to the present invention, at least one of the conductors is at least partially formed by a conductor part of a resistant conductive material so that a resistance value across this conductor is within a range of 1 $\Omega$ to 100 k$\Omega$. Even if impedance mismatching is caused between the conductors and a portion connected with the same to result in a resonance phenomenon, therefore, the quality factor of the resonance phenomenon is reduced by the conductor part of a resistant conductive material. Therefore, it is possible to effectively suppress current radiation resulting from impedance mismatching.

Thus, the flexible distribution sheet itself has a structure for suppressing electromagnetic radiation, whereby it is possible to omit a filter for removing EMI noise, which has been generally prepared in addition to the flexible distribution sheet. Consequently, it is possible to facilitate miniaturization and noise reduction in an electronic device.

Preferably, the conductor having a resistance value within a range of 1 $\Omega$ to k$\Omega$ across the same is formed to be provided with a first conductor part which is made of a resistant conductive material having relatively low resistance, and a second conductor part, being made of another resistant conductive material having relatively high resistance, which is connected to the first conductor part.

According to this preferable structure, the first conductor part is made of a resistant conductive material having higher resistivity as compared with silver or coil, which has been generally applied to such a conductor, with lower resistance as compared with the resistant conductive material forming the second conductor part. Thus, substantially no resonance phenomenon is caused by impedance mismatching between the first and second conductor parts. In other words, it is possible to further effectively prevent electromagnetic radiation resulting from impedance mismatching in the conductor, since both of the first and second conductor parts are made of resistant conductive materials. Further, the overall resistance value of the conductor having the first and second conductor parts is substantially decided by that of the second conductor part, whereby it is possible to effectively transmit a signal by maintaining the second conductor part in constant resistivity, regardless of the length of the flexible distribution sheet.

Throughout the specification, the term "resistant conductive material" indicates a material having conductivity with higher resistivity as compared with silver and copper which have been generally employed as conductor materials. Such a resistant conductive material may be prepared from a conductor film containing carbon, a cermet film, a carbon composition film made of graphite or carbon black, or a metal film of an aluminum alloy or a nickel alloy.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A to 2C are a plan view for illustrating a flexible distribution sheet according to a second embodiment of the present invention and sectional views taken along the lines 2B—2B and 2C—2C in FIG. 2A respectively;

FIG. 3 is a plan view showing a flexible distribution sheet according to a third embodiment of the present invention;

DESCRIPTION OF THE PREFERRED EMBODIMENTS

Embodiments of the present invention are now described with reference to the drawings, in order to clarify the present invention.

First Embodiment

Figure 1A:
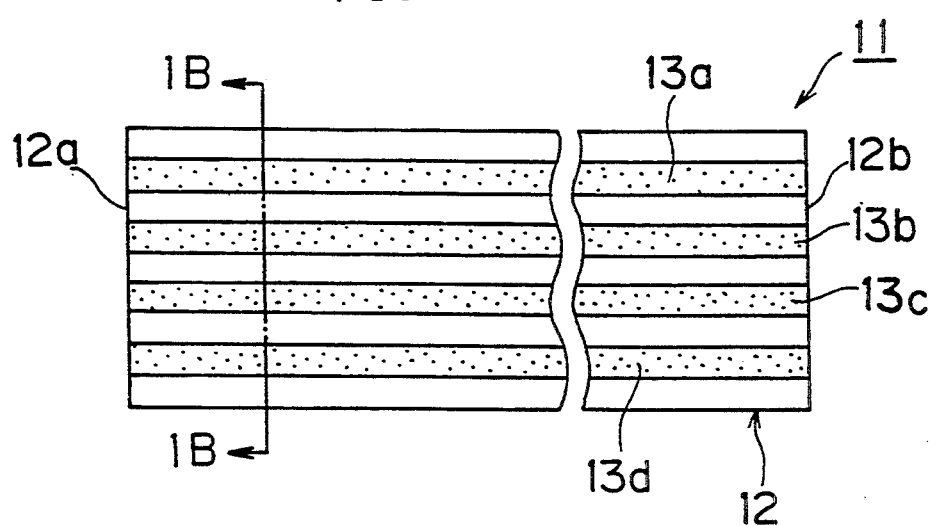
FIGS. 1A and 1B are a plan view showing a flexible distribution sheet according to a first embodiment of the present invention and a sectional view taken along the line 1B—1B in FIG. 1A respectively.
Figure 1B:
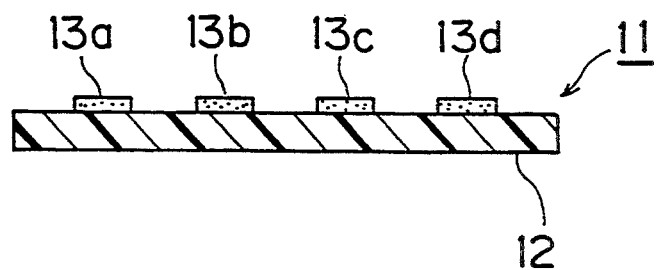

FIGS. 1A and 1B are a plan view showing a flexible distribution sheet 11 according to a first embodiment of the present invention and a sectional view taken along the line 1B—1B in FIG. 1A respectively.

The flexible distribution sheet 11 comprises a long sheet 12 having flexibility. The long sheet 12 is made of synthetic resin such as polyester or polyimide, for example. A plurality of conductors 13a to 13d are formed on an upper surface of the sheet 12, to extend from an end 12a toward another end 12b of the sheet 12. Similar conductors may also be formed on a back surface of the sheet 12.

The plurality of conductors 13a to 13d are formed by resistant conductive materials, so that resistance values across the same are within a range of 1 Ω to 100 kΩ. The resistant conductive materials are prepared from carbon coating films which are formed by baking carbon paste, carbon composition films which are made of graphite or carbon black, cermet films, or the like. Or, the conductors 13a to 13d may be made of a metal such as an aluminum alloy or a nickel alloy, which has higher resistivity as compared with silver and copper. In short, the conductors 13a to 13d can be formed by arbitrary materials having slightly higher resistance as compared with other good conductive materials, such as copper, which have been generally applied to conductor materials, and being capable of implementing resistance values within the aforementioned range across the conductors.

In the flexible distribution sheet 11 according to this embodiment, the plurality of conductors 13a to 13d are so formed that resistance values across the same are within the range of 1 Ω to 100 kΩ. Even if impedance mismatching is caused between the conductors 13a to 13d and a portion which is connected with the same to result in a resonance phenomenon, therefore, the quality factor of this resonance phenomenon is reduced by the aforementioned resistivity. Thus, it is possible to effectively suppress electromagnetic radiation toward the periphery.

Second Embodiment

FIGS. 2A to 2C are a plan view showing a flexible distribution sheet 21 according to a second embodiment of the present invention and sectional views taken along the lines 2B—2B and 2C—2C in FIG. 2A respectively.

In the flexible distribution sheet 21 according to the second embodiment, a cover film 14 is provided on upper surfaces of long conductors 13a to 13d, to cover portions other than those around both ends thereof. The cover film 14 can be formed by applying synthetic resin such as polyester or polyimide on a sheet 12 which is provided with the conductors 13a to 13d in a melted state and hardening the same, or sticking a film of such synthetic resin onto the sheet 12.

Other points of this embodiment are similar to those of the first embodiment, and hence corresponding portions are denoted by corresponding reference numerals, to omit redundant description.

Also in the second embodiment, it is possible to effectively suppress electromagnetic radiation to the exterior even if impedance mismatching is caused in the end portions of the conductors 13a to 13d, since resistance values of the conductors 13a to 13d are within the aforementioned range.

Third Embodiment

FIG. 3 is a plan view showing a flexible distribution sheet 31 according to a third embodiment of the present invention. The flexible distribution sheet 31 comprises a plurality of conductors 33a to 33d which are formed on an upper surface of a long sheet 12 having flexibility to extend from an end 12a to another end 12b thereof. This embodiment is different from the first embodiment in a point that conductor parts 34a to 34d of a resistant conductive material are formed on intermediate portions of the plurality of conductors 33a to 33d. The material and the width of the conductor parts 34a to 34d are so selected as to implement resistance values within the range of 1 Ω to 100 kΩ across the conductors 33a to 33d. Similarly to the plurality of conductors 13a to 13d according to the first embodiment, the conductor parts 34a to 34d can be prepared from coating films which are formed by baking carbon paste, carbon composition films, cermet films or metal films of an aluminum alloy or a nickel alloy.

Also according to the third embodiment, it is possible to effectively suppress electromagnetic radiation to other portions resulting from impedance mismatching, since the conductor parts 34a to 34d are so provided that resistance values across the conductors 33a to 33d are within the range of 1 Ω to 100 kΩ.

Fourth Embodiment

Figure 4:
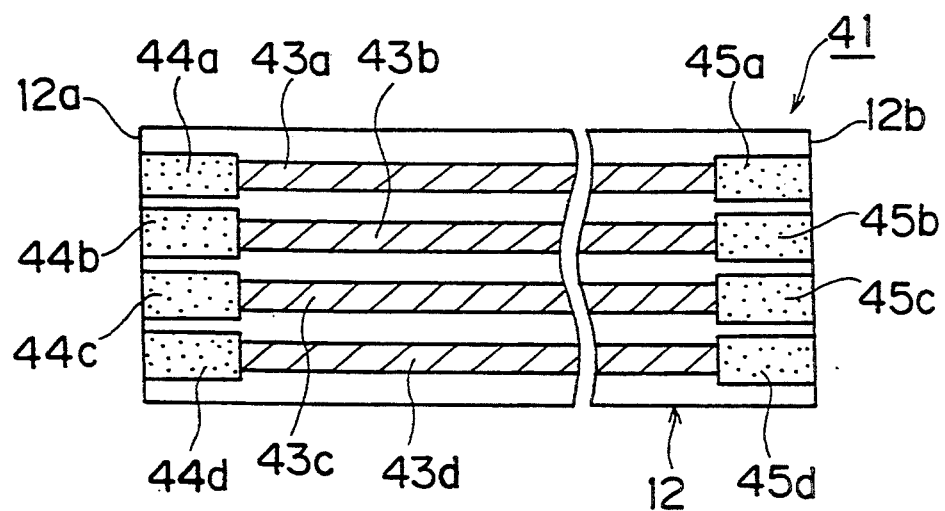
FIG. 4 is a plan view showing a flexible distribution sheet according to a fourth embodiment of the present invention.

FIG. 4 is a plan view showing a flexible distribution sheet 41 according to a fourth embodiment of the present invention. In the flexible distribution sheet 41 according to the fourth embodiment, a plurality of conductors 43a to 43d are formed on an upper surface of a long sheet 12 having flexibility to extend from an end 12a to another end 12b thereof.

The feature of this embodiment resides in that conductor parts 44a to 44d and 45a to 45d of a resistant conductive material are formed on both end portions of the respective conductors 43a to 43d. These conductor parts 44a to 44d and 45a to 45d are so formed that resistance values across the plurality of conductors 43a to 43d are within the range of 1 Ω to 100 kΩ. Namely, this embodiment is different from the third embodiment in a point that conductor parts of a resistant conductive material are provided on portions around both ends of the plurality of conductors, in order to implement resistance values within the aforementioned range.

Fifth Embodiment

Figure 5:
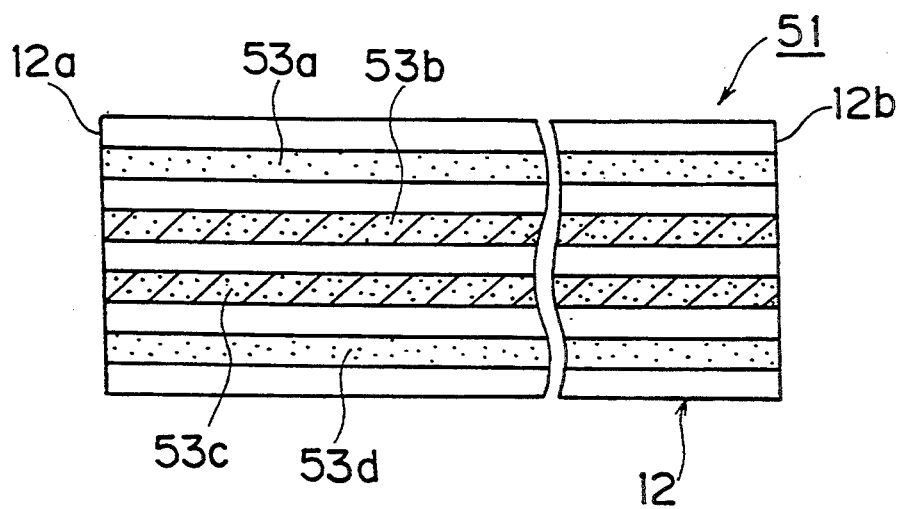
FIG. 5 is a plan view showing a flexible distribution sheet according to a fifth embodiment of the present invention.

FIG. 5 is a plan view showing a flexible distribution sheet 51 according to a fifth embodiment of the present invention. In this flexible distribution sheet 51, a plurality of conductors 53a to 53d are formed on an upper surface of a long sheet 12 having flexibility to extend from an end 12a to another end 12b thereof. Among the plurality of conductors 53a to 53d, the outer conductors 53a and 53d are formed by resistant conductive materials having resistance values within the range of 1 Ω to 100 kΩ across the same. In other words, the outer conductors 53a and 53d are formed similarly to the conductors 13a to 13d according to the first embodiment.

On the other hand, the inner conductors 53b and 53c are formed by materials having relatively lower resistance than those forming the outer conductors 53a and 53d. Namely, the inner conductors 53b and 53b can be formed by carbon coating films, carbon composition films, metal films or cermet films similarly to the outer conductors 53a and 53d, while resistance values across the same are rendered lower than those across the outer conductors 53a and 53d.

In the flexible distribution sheet 51 according to the fifth embodiment, it is possible to effectively suppress electromagnetic radiation resulting from impedance mismatching in the outer conductors 53a and 53d similarly to the first embodiment, while a similar effect of suppressing electromagnetic radiation, which is attained by the inner conductors 53b and 53c, is smaller than that attained by the outer conductors 53a and 53d.

Therefore, the flexible distribution sheet 51 according to the fifth embodiment can be suitably applied to a cable containing a dc supply line which must feed a large amount of current and a digital signal line having a large amount of noise components in a mixed state, for example.

Sixth Embodiment

Figure 6:
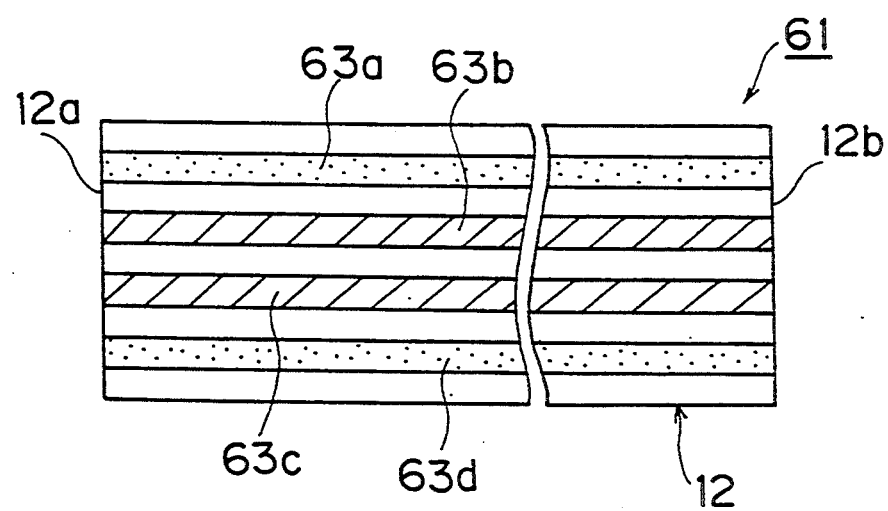
FIG. 6 is a plan view showing a flexible distribution sheet according to a sixth embodiment of the present invention.

FIG. 6 shows a flexible distribution sheet 61 according to a sixth embodiment of the present invention. This flexible distribution sheet 61, which is a modification of the flexible distribution sheet 51 according to the fifth embodiment, is characterized in that conductors 63b and 63c, which are arranged on inner sides among a plurality of conductors 63a to 63d, are made of a material having excellent conductivity such as silver or copper, similarly to conductors in a general flexible distribution sheet. The outer conductors 63a and 63d are so formed that resistance values across the same are within the range of 1 Ω to 100 kΩ, similarly to the conductors 13a to 13d according to the first embodiment.

Thus, the flexible distribution sheet 61 according to the sixth embodiment can also be suitably applied to a cable containing a dc supply line which must feed a large amount of current and a digital signal line having a large amount of noise components in a mixed state, similarly to the fifth embodiment.

Although the upper surfaces of the plurality of conductors are not covered with an insulating material in each of the third to sixth embodiments similarly to the first embodiment, a cover film may be formed also in each of these embodiments similarly to the second embodiment, to insulate and cover the both ends of the conductors and portions close thereto.

Seventh and eighth embodiments of the present invention, which are more preferable than the first to sixth embodiments, are now described.

Seventh Embodiment

Figure 7A:
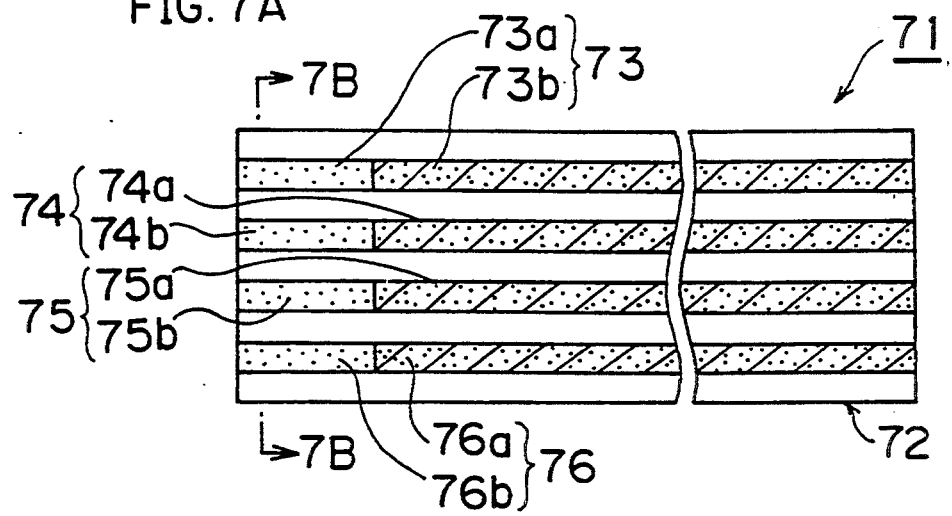
FIGS. 7A and 7B are a plan view showing a flexible distribution sheet according to a seventh embodiment of the present invention and a sectional view taken along the line 9B—9B in FIG. 7A respectively.
Figure 7B:
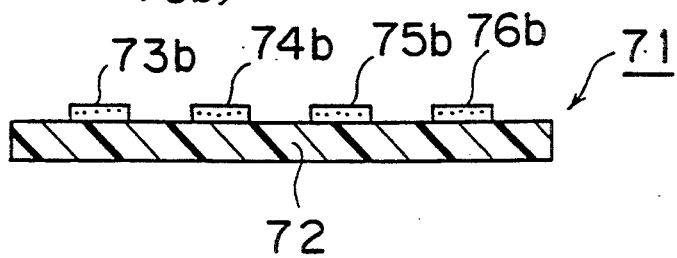

FIGS. 7A and 7B are a plan view showing a flexible distribution sheet 71 according to a seventh embodiment of the present invention and a sectional view taken along the line 7B—7B in FIG. 7A respectively.

The flexible distribution sheet 71 according to this embodiment has a long sheet 72 having flexibility. This sheet 72 is formed by a material, such as a synthetic resin film, for example, having sufficient flexibility. A plurality of conductors 73 to 76 are formed on an upper surface of the sheet 72 in parallel with each other. The conductors 73 to 76 are formed by connecting first conductor parts 73a to 76a, which are made of a resistant conductive material having relatively low resistance, and second conductor parts 73b to 76b, which are made of another resistant conductive material having relatively high resistance, with each other. Namely, a plurality of conductor parts 73a to 76a having low resistance are partially replaced by the second conductor parts 73b to 76b having high resistance.

The conductors 73 to 76 are so formed that resistance values across the same are within the range of 1 Ω to 100 kΩ. Similarly to the flexible distribution sheets according to the first to sixth embodiments, therefore, it is possible to reduce the quality factor of a resonance phenomenon resulting from impedance mismatching which may be caused when the flexible distribution sheet 71 is connected to another device or another part, thereby suppressing electromagnetic radiation to the exterior.

In the flexible distribution sheet 71 according to this embodiment, further, the first conductor parts 73a to 73d are formed by materials having higher specific resistance than silver or copper, which has generally been employed as a material for forming conductors, such as carbon films formed by baking carbon paste, carbon composition films, cermet films or films of a metal having higher resistivity than silver and copper, for example. The second conductor parts 73b to 73b are also formed by similar materials. Thus, difference between resistance values of the first and second conductor parts 73a to 73d and 73b to 76b is smaller than that between the resistance values of the conductor parts 43a to 43d and 44a to 44d of metals in the flexible distribution sheet 41 shown in FIG. 4. Therefore, impedance mismatching is hardly caused in connected portions between the first and second conductor parts 73a to 76a and 73b to 76b as compared with the flexible distribution sheet 41 shown in FIG. 4. Thus, it is possible to further effectively suppress unnecessary electromagnetic radiation resulting from impedance mismatching in the conductors 73 to 76.

Further, the resistance values across the plurality of conductors 73 to 76 are within the range of 1 Ω to 100 kΩ as described above while the overall resistance value is substantially decided by those of the high-resistance second conductor parts 73b to 76b. When the resistance values across the second conductor parts 73b to 76b are maintained constant, therefore, it is possible to effectively suppress fluctuation of the resistance value of the flexible distribution sheet 71 regardless of fluctuation in its length. Thus, it is possible to stably transmit effective signals through the conductors 73 to 76.

Eighth Embodiment

Figure 8:
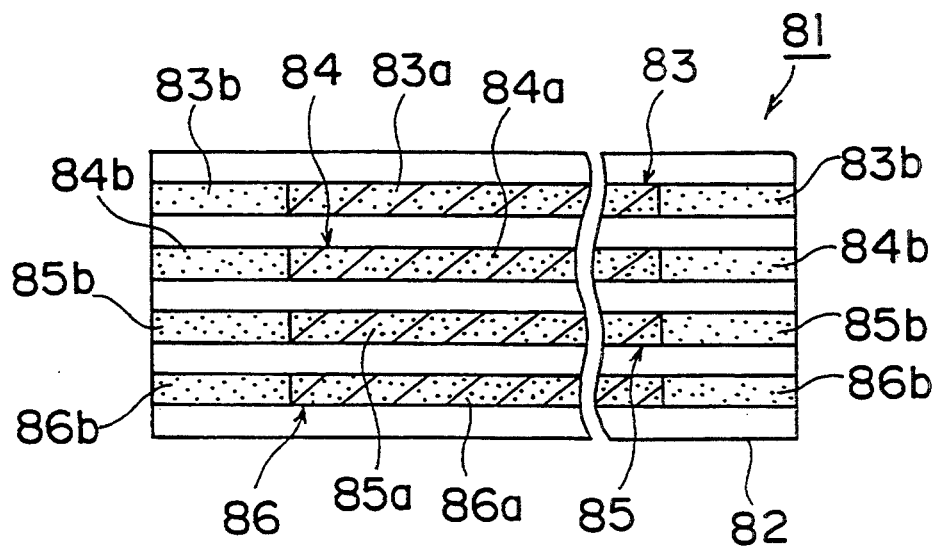
FIG. 8 is a plan view showing a flexible distribution sheet according to an eighth embodiment of the present invention.
Figure 9A:
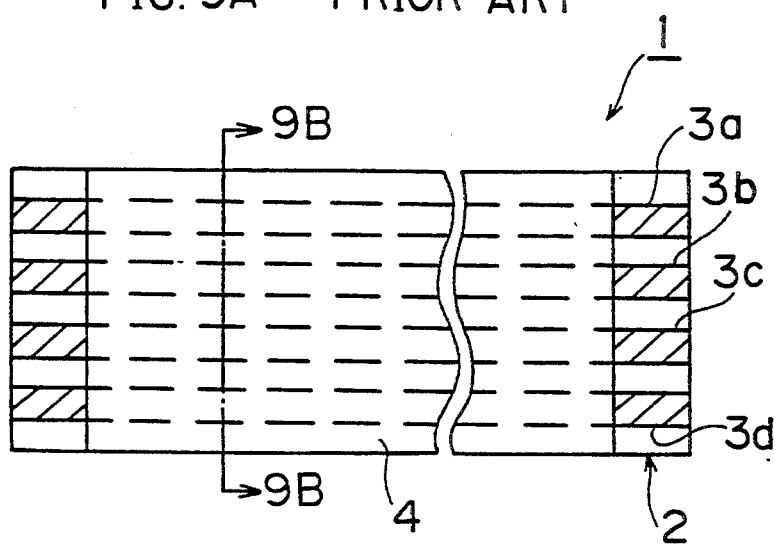
FIGS. 9A and 9B are a plan view for illustrating a conventional flexible sheet and a sectional view taken along the line 9B—9B in FIG. 9A respectively.
Figure 9B:
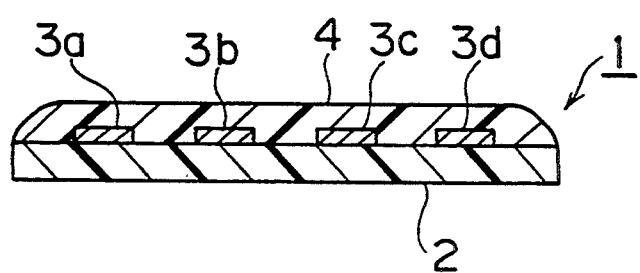

FIG. 8 is a plan view showing a flexible distribution sheet 81 according to an eighth embodiment of the present invention. In the eighth embodiment, first conductor parts 83a to 86a which are made of a resistant conductive material having relatively low resistance are arranged on central portions of a plurality of conductors 83 to 86, while second conductor parts 83b to 86b which are made of another resistant conductive material having relatively high resistance are formed on both ends thereof. Other points are similar to those of the seventh embodiment.

Also when the second conductor parts 83b to 86b of a resistant conductive material having relatively high resistance are connected to both ends of the first conductor parts 83a to 86a, it is possible to effectively suppress electromagnetic radiation to the exterior, similarly to the seventh embodiment.

In the flexible distribution sheets 71 and 81 according to the seventh and eighth embodiments, the conductors 73 to 76 and 83 to 86 can be easily formed on the sheets 72 to 82 in practice by forming the second conductor parts 73b to 76b and 83b to 86b of resistant conductive materials having high resistance along the overall lengths of the sheets 72 and 82 and thereafter forming the first conductor parts 73a to 76a and 83a to 86a of resistant conductive materials having low resistance to expose portions of the second conductor parts 73b to 76b and 83b to 86b by required lengths. Thus, it may be understood that the first and second conductor parts 73a to 76a, 83a to 86a, 73b to 76b and 83b to 86b may not necessarily be butted against each other.

Although the plurality of conductors are formed only on the upper surfaces of the long sheets 72 and 82 in the seventh and eighth embodiments, similar plural conductors may also be formed on the lower surfaces.

Further, cover film layers may be formed to cover portions of the plurality of conductors 73 to 76 and 83 to 86 other than those around the both ends with insulating resin layers, thereby ensuring electric insulation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A flexible distribution sheet for suppressing electromagnetic radiation in an electronic device, the flexible distribution sheet comprising:
   a long sheet having flexibility; and
   a plurality of long conductors formed on said sheet to extend along a longitudinal direction of said sheet, at least one of said conductors being at least partially made of a resistant conductive material so that a resistance value across said conductor is within a range of 1 Ω to 100 kΩ such that electromagnetic radiation is suppressed when an electrical signal passes in said flexible distribution sheet.

2. A flexible distribution sheet in accordance with claim 1, wherein said conductor having a resistance value within said range of 1 Ω to 100 kΩ is made of said resistant conductive material along its overall length.

3. A flexible distribution sheet in accordance with claim 1, wherein all of said conductors are made of said plurality of resistant conductive material so that resistance values across said conductors are within said range of 1 Ω to 100 kΩ.

4. A flexible distribution sheet in accordance with claim 3, wherein all of said plurality of conductors are made of said resistant conductive material along their respective overall lengths.

5. A flexible distribution sheet in accordance with claim 1, wherein a cover film layer of synthetic resin is formed to cover said plurality of conductors.

6. A flexible distribution sheet in accordance with claim 1, wherein said conductor having a resistance value within said range of 1 Ω to 100 kΩ across the same is prepared by forming a conductor part of said resistant conductive material in an intermediate position of a conductor of a metal.

7. A flexible distribution sheet in accordance with claim 1, wherein said conductor having a resistance value within said range of 1 Ω to 100 kΩ is prepared by connecting a conductor part of said resistant conductive material to each end of a conductor of a metal.

8. A flexible distribution sheet in accordance with claim 1, wherein said at least one of said plurality of conductors is formed by a conductor of said resistant conductive material having a resistance value within said range of 1 Ω to 100 kΩ and the remaining of said plurality of conductors are made of low-resistance conductor materials having resistance values that are lower than said resistance valve across said conductor of said resistant conductor material.

9. A flexible distribution sheet in accordance with claim 1, wherein said at least one of said plurality of conductors is formed by a conductor of said resistant conductive material so that a resistance value across the conductor is within said range of 1 Ω to 100 kΩ, and the remaining of said plurality of conductors are made of conductors of a metal.

10. A flexible distribution sheet in accordance with claim 1, wherein said at least one conductor having a resistance value within said range of 1 Ω to 100 kΩ has a first conductor part and a second conductor part, the first conductor part being made of a resistant conductive material having relatively low resistance and the second conductor part being made of another resistant conductive material having relatively high resistance, the second conductor part being connected to said first conductor part.

11. A flexible distribution sheet in accordance with claim 10, wherein said second conductor part is connected to an end of said first conductor part.

12. A flexible distribution sheet in accordance with claim 10, wherein said second conductor part is connected to each end of said first conductor part.

13. A flexible distribution sheet in accordance with claim 10, wherein each of said plurality of conductors has said first and second conductor parts so that a resistance value across the conductor is within said range of 1 Ω to 100 kΩ.

14. A flexible distribution sheet in accordance with claim 1, wherein said resistant conductive material is a material having a higher resistivity than silver and copper.

* * * * *